(12) United States Patent
Kang et al.

(10) Patent No.: US 8,048,738 B1
(45) Date of Patent: Nov. 1, 2011

(54) METHOD FOR FORMING A SPLIT GATE DEVICE

(75) Inventors: Sung-Taeg Kang, Austin, TX (US);
Cheong Min Hong, Austin, TX (US);
Brian A. Winstead, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 12/760,313

(22) Filed: Apr. 14, 2010

(51) Int. Cl.
*H01L 21/336* (2006.01)
*H01L 21/4763* (2006.01)
*H01L 21/461* (2006.01)

(52) U.S. Cl. ........ 438/257; 438/267; 438/593; 438/689; 438/706; 438/734; 257/E21.209; 257/E21.645; 257/E21.681

(58) Field of Classification Search ........... 257/E21.209, 257/E21.645, E21.681
See application file for complete search history.

(56) References Cited

U.S. PATENT DOCUMENTS

| | | | |
|---|---|---|---|
| 6,232,185 B1 | 5/2001 | Wang | |
| 6,706,601 B1 * | 3/2004 | Liu et al. | 438/266 |
| 7,202,170 B2 * | 4/2007 | Liu et al. | 438/689 |
| 7,202,524 B2 | 4/2007 | Kim et al. | |
| 7,274,068 B2 | 9/2007 | Forbes | |
| 7,341,912 B2 * | 3/2008 | Choi et al. | 438/257 |
| 7,477,542 B2 | 1/2009 | Forbes | |
| 2008/0090349 A1 | 4/2008 | Hoentschel et al. | |
| 2008/0274611 A1 * | 11/2008 | Cabral et al. | 438/653 |
| 2009/0108325 A1 * | 4/2009 | Kang et al. | 257/316 |
| 2009/0152642 A1 * | 6/2009 | Bojarczuk et al. | 257/369 |

* cited by examiner

*Primary Examiner* — Mohsen Ahmadi
(74) *Attorney, Agent, or Firm* — Joanna G. Chiu; Ranjeev Singh

(57) ABSTRACT

A method for forming a semiconductor device includes forming a dielectric layer over a substrate. The method further includes forming a select gate layer over the dielectric layer. The method further includes etching the select gate layer at a first etch rate to form a first portion of a sidewall of a select gate, wherein the step of etching the select gate layer at the first etch rate includes using an oxidizing agent to oxidize at least a top portion of the substrate underlying the dielectric layer to form an oxide layer. The method further includes etching the select gate layer at a second etch rate lower than the first etch rate to form a second portion of the sidewall of the select gate, wherein the step of etching the select gate layer at the second etch rate includes removing only a top portion of the dielectric layer.

13 Claims, 7 Drawing Sheets

METHOD FOR FORMING A SPLIT GATE DEVICE

BACKGROUND

1. Field

This disclosure relates generally to semiconductor processing, and more specifically, to split gate devices.

2. Related Art

Split gate devices, which include both a select gate and a control gate, are typically used as bitcell storage devices within nonvolatile memory arrays. The use of a separate select gate for the bitcells in such arrays allows for improved isolation and reduced bitcell disturb during programming and reading of the bitcells. For example, program disturb is reduced for memory cells that are unselected but are either on the selected row or, in the alternative, on the selected column. Normally, cells on the selected row or the selected column are the most likely to be a problem for disturb regardless of the operation that is being performed on a selected cell. With the split gate memory cell having substantially solved the program disturb problem for cells on the selected rows or columns, a disturb problem with cells on unselected rows and unselected columns has become significant. One of the reasons is that the particular stress that is applied for cells on unselected rows and columns is applied for many more cycles than for a stress that is applied for cells on a selected row or column. Also, due to the length of the select gates and control gates, reduced drive current is obtained which degrades reading performance.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

As described above, split gate devices are useful as bitcells in a memory. One embodiment described herein includes a method for forming a split gate device which may allow for improved performance. For example, in one embodiment, a split gate device includes a shallow recessed region adjacent a sidewall of the select gate in which portions of the charge storage layer and the control gate are formed. Also, in one embodiment, a split gate device includes a shallow recessed region adjacent a sidewall of the select gate in which portions of the charge storage layer and the control gate are formed.

Figure 1:
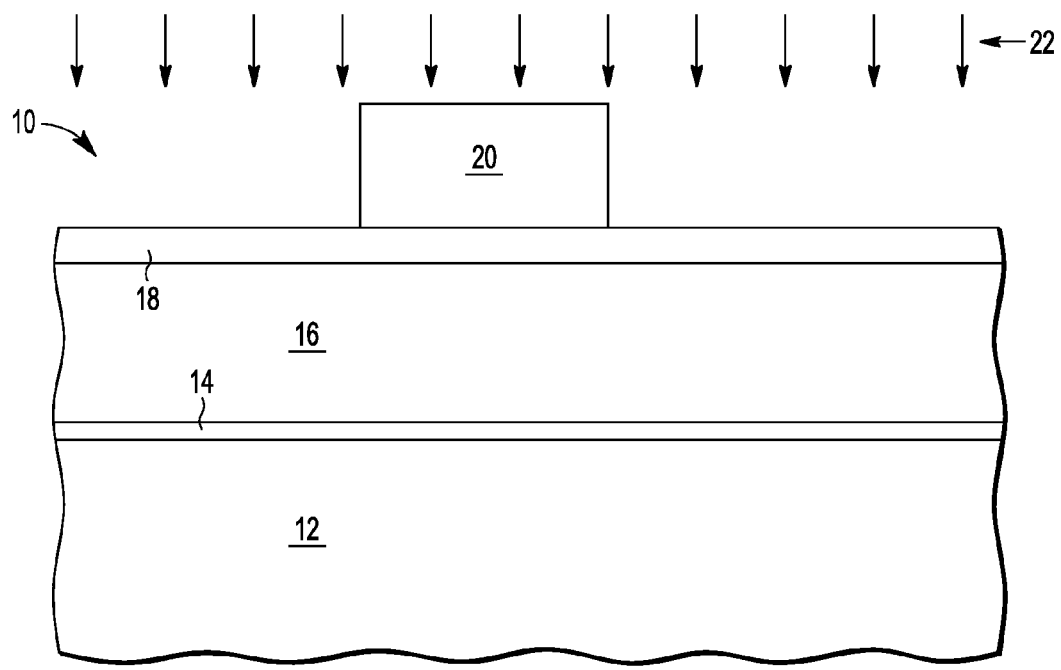
FIGS. 1-8 illustrate a method for forming a split gate semiconductor device having a shallow recess in accordance with one embodiment of the present invention.

FIG. 1 illustrates a semiconductor structure 10 having a semiconductor substrate 12. Semiconductor substrate 12 described herein can be any semiconductor material or combinations of materials, such as gallium arsenide, silicon germanium, silicon-on-insulator (SOI), silicon, monocrystalline silicon, the like, and combinations of the above. Semiconductor substrate 12 may also be referred to as a semiconductor layer. Semiconductor structure 10 includes a gate dielectric layer 14 over substrate 12, a select gate layer 16 over the gate dielectric layer 14, and an anti-reflective coating (ARC) layer 18 over select gate layer 16. Gate dielectric layer 14 may be any appropriate gate dielectric layer, such as, for example, a gate oxide layer. Select gate layer 16 may be a polysilicon gate layer. Alternatively, select gate layer 16 may also be a metal, titanium nitride, or a combination of materials. In FIG. 1, semiconductor structure 10 also includes a patterned masking layer 20 over ARC layer 18 which defines the gate electrode to be formed from select gate layer 16 and ARC layer 18. Note that patterned masking layer 20 can be formed using any known method. As indicated by the arrows in FIG. 1, a dry etch 22 is then performed on semiconductor structure 10. In one embodiment, dry etch 22 includes multiple etch steps, such as a first etch step (i.e. a breakthrough etch) to etch through ARC layer 18 followed by a second etch step (i.e. a main etch step) to etch through most of select gate layer 16. Therefore, the etch chemistry may differ between the breakthrough etch and the main etch. In one embodiment, the main etch step of dry etch 22, in addition to including an etch chemistry which etches through the material of select gate layer 16 (such as, for example, carbon fluoride, in the case that select gate layer 16 is polysilicon), the etch chemistry may also include an oxidizing agent. The oxidizing agent may include for example, oxygen ($O_2$) or helium oxide ($HeO_2$).

Figure 2:
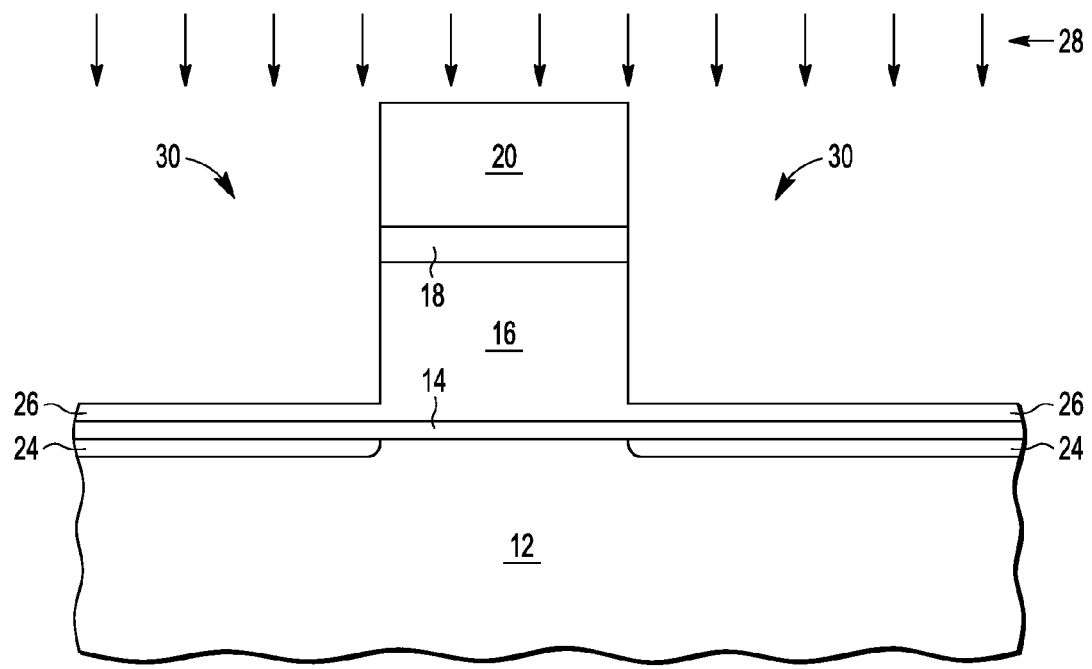

FIG. 2 illustrates semiconductor structure 10 after completion of dry etch 22 in which exposed areas of ARC layer 18 have been removed and exposed portions of select gate layer 16 have been removed, thus defining recess regions 30. Note that portions 26 of select gate layer 16 in regions 30 remain after dry etch 22, covering gate dielectric layer 14. Also, since dry etch 22 contained an oxidizing agent in its main etch step, dry etch 22 results in oxygen penetrating through portions 26 and gate dielectric 14 into semiconductor substrate 12, thus forming oxidized regions 24 under gate dielectric layer 14. After dry etch 22 is performed, a dry etch 28 is performed on semiconductor structure 10, as illustrated by the arrows in FIG. 2. In one embodiment, dry etch 28 may be referred to as a third step of the dry etch 22 (which occurs subsequent to the second step of dry etch 22). This third step may also be referred to as a soft etch step. In one embodiment, the soft etch step is performed using a lower etch power such that a lower etch rate results. In this manner, dry etch 28 is more delicate as compared to dry etch 22 and is able to more carefully land or stop within gate dielectric layer 14, as will be seen in FIG. 3. In one embodiment, a same etch chemistry may be used in both the main etch step and the soft etch step, with the exception that soft etch step may not include the oxidizing agent. In one embodiment, to result in a lower etch rate, one or more etch parameters may be changed between the main etch step and the soft etch step, such as, for example, etch chemistry, RF power, etch bias, etc., or combinations thereof.

Figure 3:
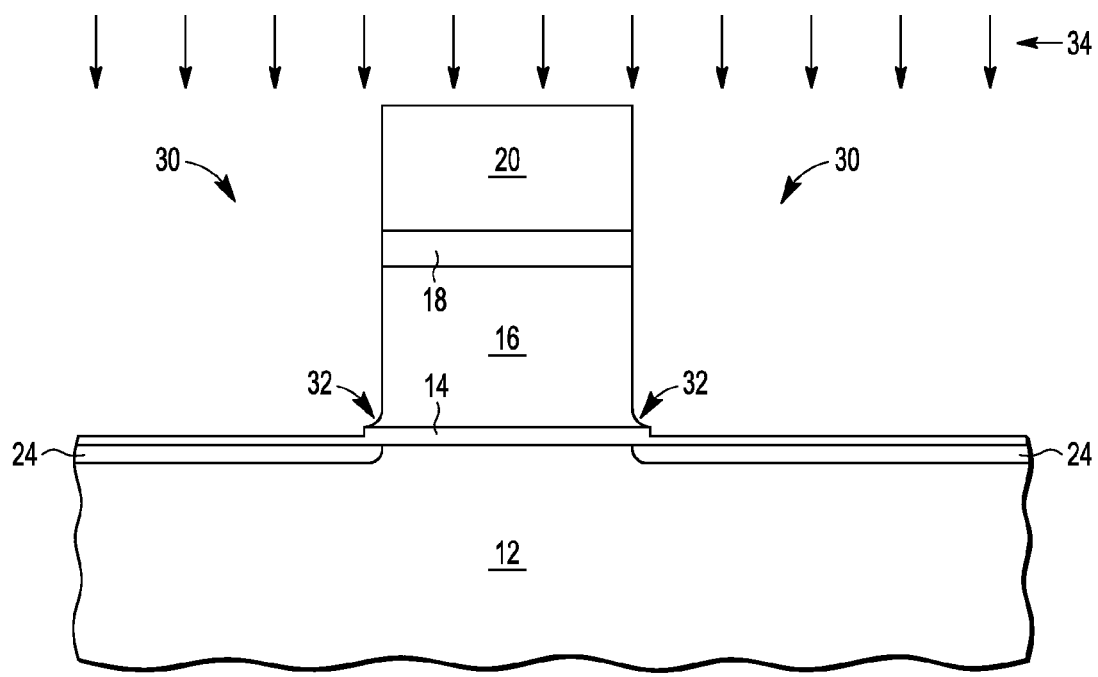

FIG. 3 illustrates semiconductor structure 10 after completion of dry etch 28 in which portions 26 of select gate layer 26 have been removed from regions 30, and exposed portions (i.e. a top portion) of gate dielectric layer 14 in regions 30 have been removed. However, note that portions of gate dielectric layer 14 in regions 30 remain after dry etch 28, covering and thus protecting oxidized regions 24 and substrate 12. Note also that, due to the lower etch rate of dry etch 28 as compared to the main etch step of dry etch 22, foot portions 32 of select gate layer 16 remain in regions 30 after dry etch 28. After dry etch 28 is performed, a dry etch 34 is performed on semiconductor structure 10, as illustrated by the arrows in FIG. 3. In one embodiment, dry etch 34 may be referred to as a fourth step of dry etch 22 (which occurs subsequent to the third etch step of dry etch 22, i.e. subsequent to the soft etch step of dry etch 28). The fourth etch step may also be referred to as an overetch step. In one embodiment, the overetch step is performed using a greater etch power than the third etch rate such that foot portions 32 can be removed, as well as all of gate dielectric layer 14 in regions 30 and portions of oxidized regions 24. In one embodiment, one or more etch parameters may be changed between the soft etch step and the overetch step, such as, for example, etch chemistry, RF power, etch bias, etc., or combinations thereof.

Figure 4:
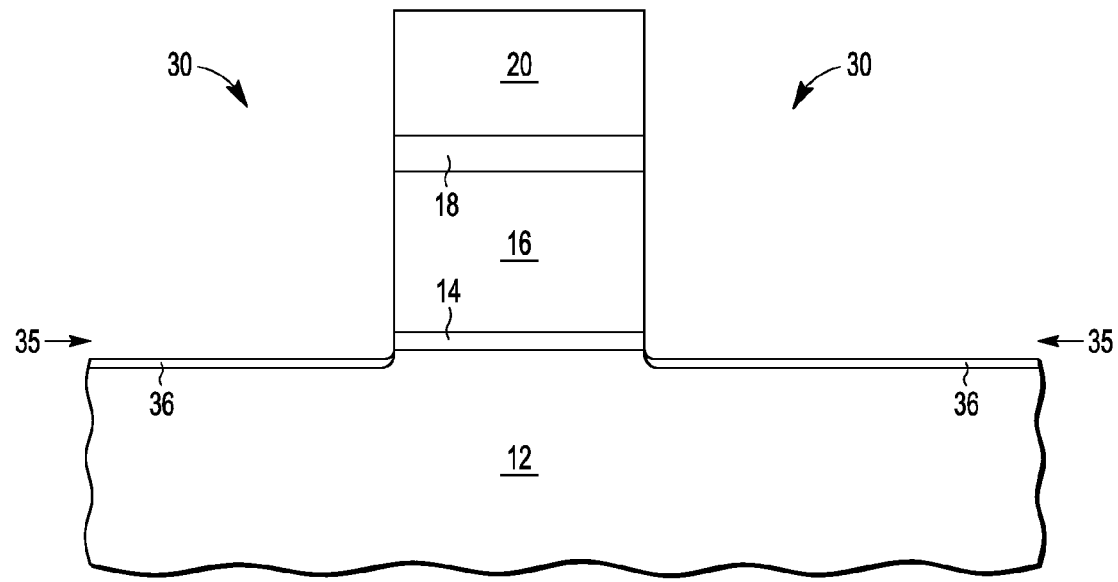

FIG. 4 illustrates semiconductor structure 10 after completion of dry etch 34, in which all exposed portions of gate dielectric layer 14 in regions 30, foot portions 32, and portions of oxidized regions 24 have been removed. Note that the remaining portion of select gate layer 16 under patterned masking layer 20 can be referred to as the select gate electrode (or the select gate), and the remaining portion of gate dielectric layer 14 under patterned masking layer 20 can be referred to as the gate dielectric. Therefore, after removal of the portions of oxidized regions 24, recesses 35 are formed in substrate 12 in regions 30, adjacent the select gate electrode, where an oxide layer 36 remains in recesses 35 (representing the remaining portions of oxidized regions 24). Therefore, recesses 35 result in substrate 12 having a recessed top surface as compared to the top surface of substrate 12 located under gate dielectric 14 and select gate electrode 16. In one embodiment, recesses 35 may be referred to as shallow recesses and have a depth of approximately 15 Angstroms from the top surface of substrate 12 located under gate dielectric 14.

Figure 5:
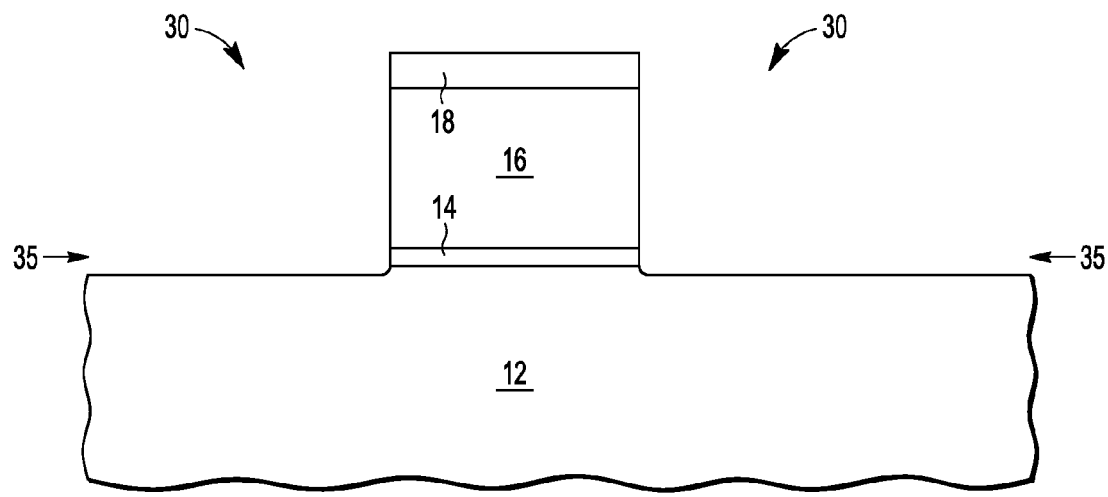

FIG. 5 illustrates semiconductor structure 10 after removal of patterned masking layer 20 and oxide layer 36. In one embodiment, a first wet etch may be performed to remove patterned masking layer 20 and second wet etch, having a different etch chemistry, may be performed to remove oxide layer 36. In an alternate embodiment, oxide layer 36 may not be removed.

Figure 6:
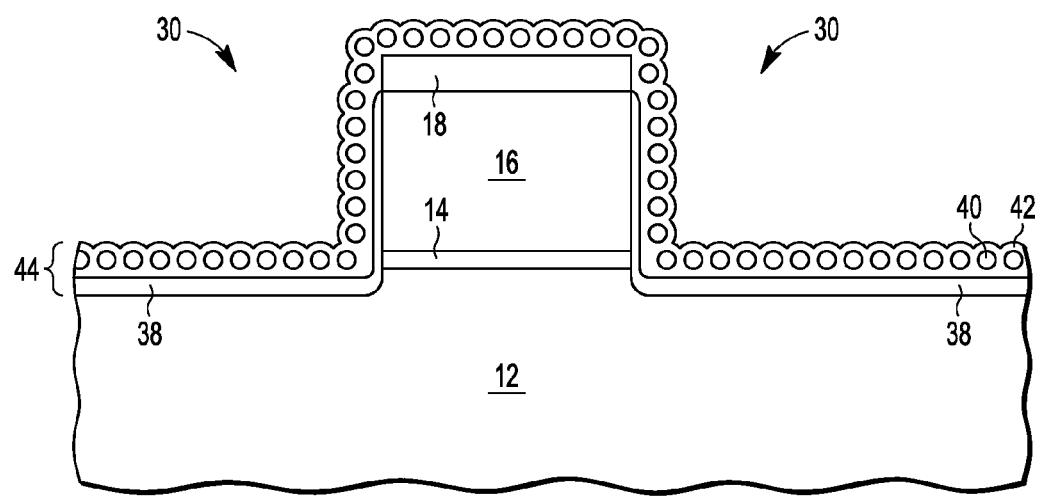

FIG. 6 illustrates semiconductor structure 10 after forming a charge storage layer 44 over substrate 12 in recesses 35 and over select gate electrode 16. In one embodiment, formation of charge storage layer 44 begins with growing an oxide 38 on exposed portions of substrate 12 in recesses 35 and along sidewalls of select gate electrode 16. (Note that, in the case that oxide layer 36 is not removed, oxide 38 is grown on oxide layer 36 in recesses 35 where oxide layer 36 becomes part of oxide 38.) In one embodiment, oxide 38 is grown to a thickness in a range of approximately 4 to 10 nanometers. After formation of oxide 38, nanocrystals 40 and an insulating layer 42 surrounding nanocrystals 40 are formed over oxide layer 36 and select gate electrode 16 (e.g. over ARC layer 18 of gate electrode 16). In one embodiment, nanocrystals 40 have diameters in a range of approximately 3 to 20 nanometers. Conventional processing may be used to form nanocrystals 40. Nanocrystals 40 may include any type of conductive material, such as, for example, silicon, germanium, a metal, or the like. Insulating layer 42 is formed over and surrounding nanocrystals 40, and, in one embodiment, is an oxide layer. Alternatively, insulating layer 42 may include hafnium oxide, aluminum oxide, etc. In one embodiment, insulating layer 42 has a thickness in a range of 8 to 20 nanometers. Therefore, note that oxide 38 (over substrate 12), nanocrystals 40, and insulating layer 42 form charge storage layer 44. In one embodiment, charge storage layer 44 has a total thickness in a range of approximately 12 to 30 nanometers. Therefore, in one embodiment, charge storage layer 44 may be referred to as a thin storage layer which has a thickness of at most approximately 30 nanometers. Note that a portion of charge storage layer 44 is formed in recesses 35 and another portion of charge storage layer 44 is formed along a first sidewall of select gate electrode 16. In alternate embodiments, any type of charge storage layer may be used. For example, charge storage layer 44 may include a single nitride layer, a trap oxide layer, or may include a stack of different layers.

Figure 7:
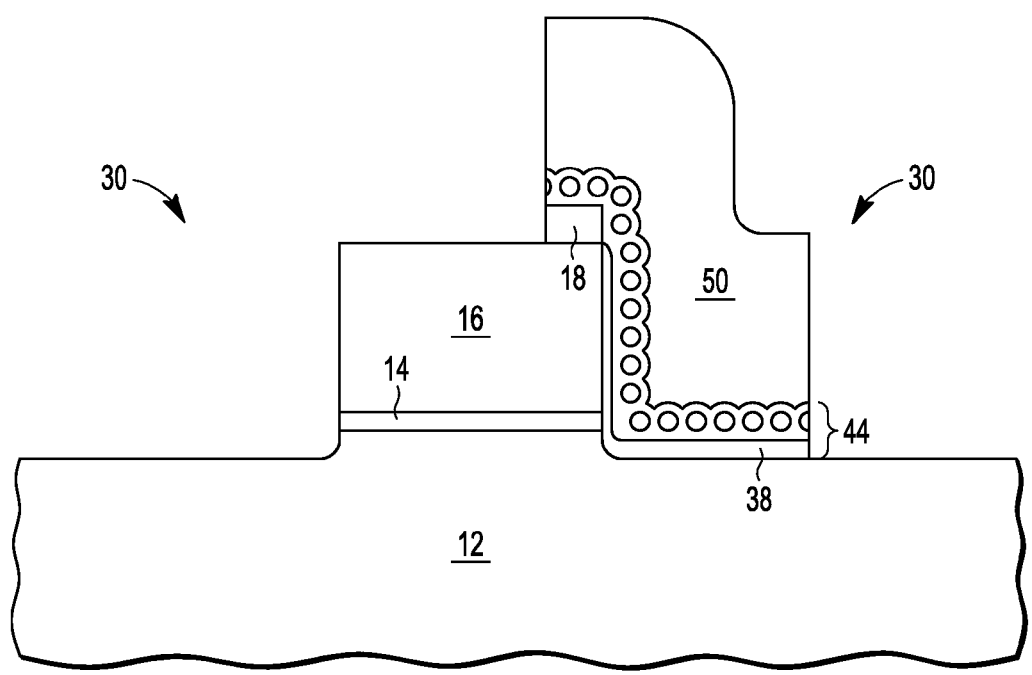

FIG. 7 illustrates semiconductor structure 10 after formation of a control gate electrode 50 (also referred to as control gate 50) over a portion of select gate electrode 16 and over substrate 12 within recess 35 adjacent a first sidewall of select gate electrode 16. That is, note that control gate electrode 50 is formed such that it overlies a portion of select gate electrode 16 and extends over a sidewall of select gate electrode 16 onto substrate 12 within recess 35 adjacent the sidewall of select gate electrode 16. In one embodiment, control gate electrode 50 is formed using conventional deposition and etching techniques. Note that during the etch to form control gate electrode 50, portions of charge storage layer 44 are also etched, such that charge storage layer 44 remains between control gate electrode 50 and select gate electrode 16 and between control gate electrode 50 and substrate 12. In one embodiment, control gate electrode 50 may include polysilicon, a metal, titanium nitride, etc., or combinations thereof.

Figure 8:
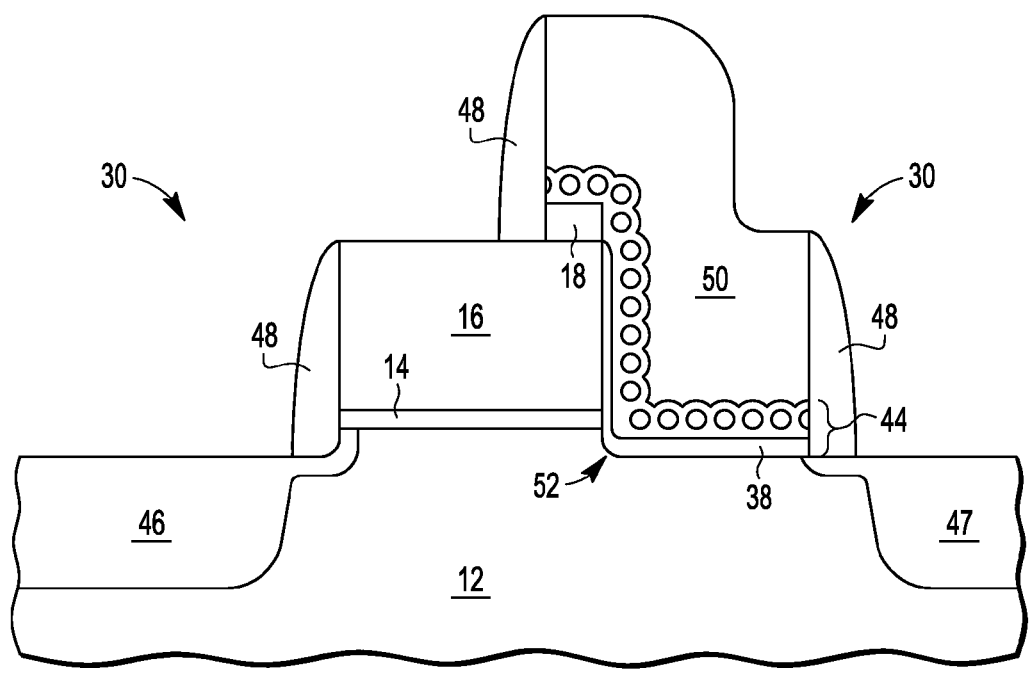

FIG. 8 illustrates semiconductor structure 10 after formation of spacers 48 and formation of source/drain regions 46 and 47 in substrate 12 to form a substantially completed split gate device. A first spacer of spacers 48 is formed along a sidewall of select gate electrode 16, and a second and third spacer of spacers 48 are formed along sidewalls of charge storage layer 44 and control gate electrode 50. Conventional processing and materials may be used to form spacers 48. Conventional processing may be used to form source/drain regions 46 and 47. In one embodiment, source/drain region 46 includes an extension region which extends under gate dielectric layer 14 and source/drain region 47 includes an extension region which extends under charge storage layer 44. In one embodiment, source/drain region 47 may be referred to as a source region which is adjacent a first sidewall of select gate electrode 16 where a portion of control gate electrode 50 is between the first sidewall of select gate electrode 16 and the source region, and source/drain region 46 may be referred to as a drain region which is adjacent a second sidewall of select gate electrode 16.

Therefore, a substantially completed nanocrystal split gate device (also referred to as a split gate bitcell) is illustrated in FIG. 8. Note that rounded corner 52 allows for a thicker oxide in these corners underlying nanocrystals 40. This may allow for an increased breakdown voltage and thus helps improve program and erase operation. Also, the thicker oxide may also allow for different polarities of an erase operation of the device and may also reduce any gap nanocrystal effect. The recessed regions in which charge storage layer 44 is formed may also allow for improved program operation due to improved ballistic injection and improved current drive.

Figure 9:
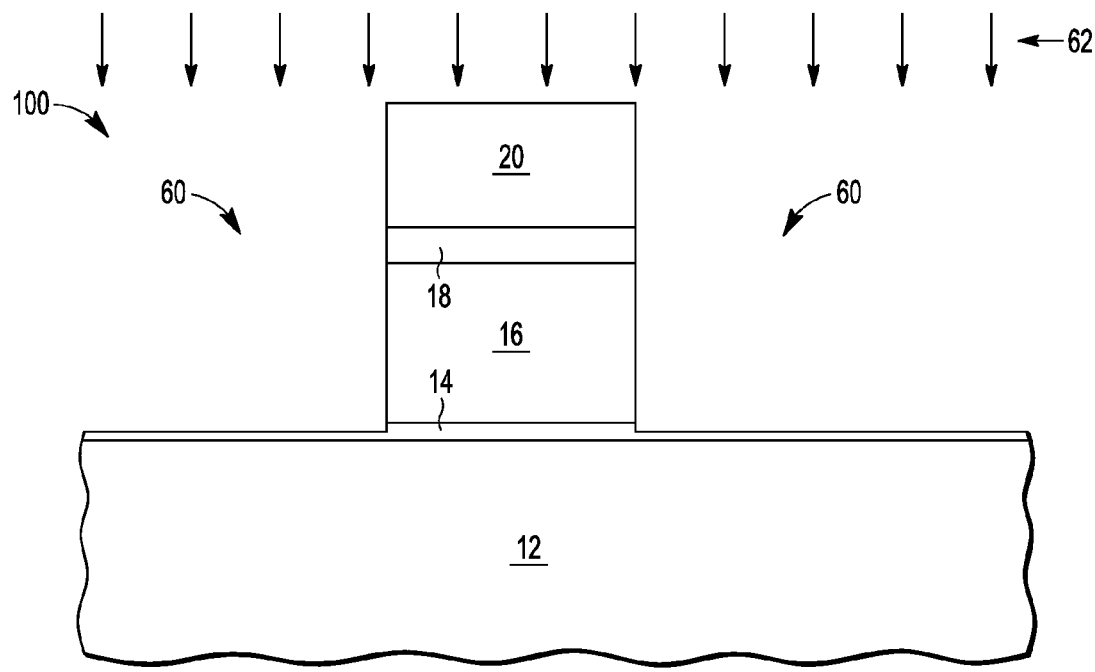
FIGS. 9-14 illustrate a method for forming a split gate transistor device having a deep recess in accordance with one embodiment of the present invention.

FIG. 9 illustrates a semiconductor structure 100 which may correspond to semiconductor structure 10 after dry etch 22 in accordance with another embodiment of the present invention. Therefore, prior to FIG. 9, semiconductor structure 100 is the same as semiconductor structure 10 in FIG. 1. In the current example, dry etch 22 of FIG. 1 includes a first step (i.e. a main etch step) which etches through exposed portions of ARC layer 18 and select gate layer 16, and etches into gate dielectric layer 14, removing portions of gate dielectric layer 14. Referring to semiconductor structure 100 of FIG. 9, the remaining portion of select gate layer 16 under patterned masking layer 20 may be referred to as select gate electrode 16 (or select gate 16). Therefore, recess regions 60 are defined on either side of select gate electrode 16. Note that not all of gate dielectric layer 14 in regions 60 is removed, such that a portion of gate dielectric layer 14 in regions 60 remains covering substrate 12. In the current example, the main etch step includes an etch chemistry which etches through the material of select gate layer 16 (such as, for example, carbon fluoride, in the case that select gate layer 16 is polysilicon), and does not include an oxidizing agent. After dry etch 22 is performed, dry etch 62 is performed on semiconductor structure 100, as illustrated by the arrows of FIG. 9. In one embodiment, dry etch 62 may be referred to as a second step of dry etch 22 (which occurs subsequent to the first etch step), and may be referred to as a breakthrough etch step. In one embodiment, the breakthrough etch etches through gate dielectric 14 to substrate 12, thus removing all exposed portions of gate dielectric 14 in regions 60.

Figure 10:
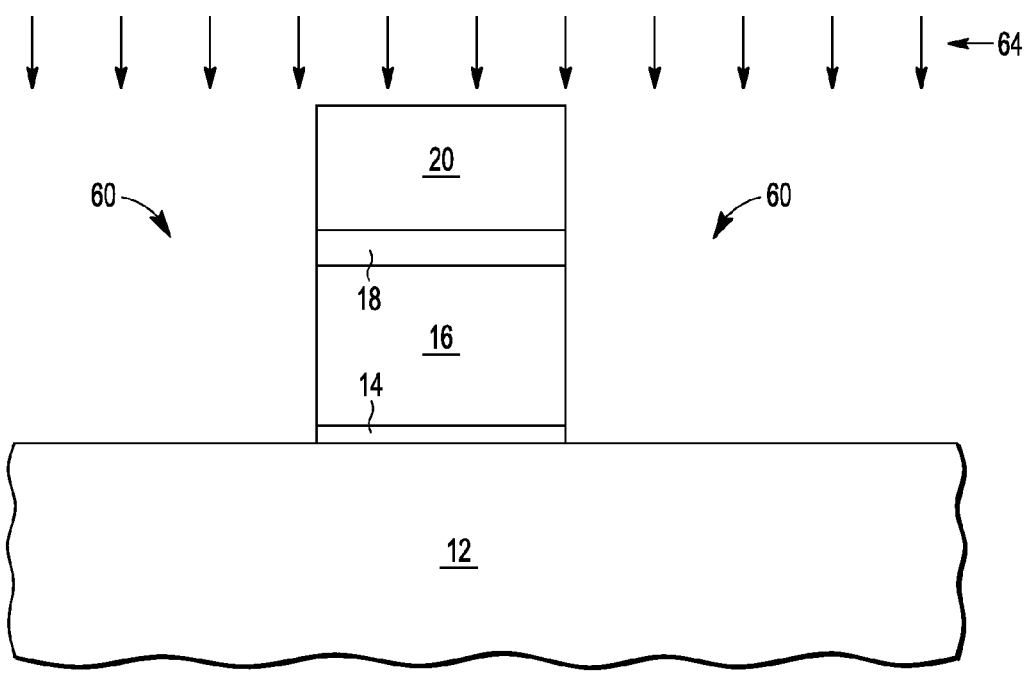

FIG. 10 illustrates semiconductor structure 100 after completion of dry etch 62 (i.e. after the breakthrough etch) in which substrate 12 is exposed in regions 60. After dry etch 62 is performed, a dry etch 64 is performed on semiconductor structure 100, as illustrated by the arrows of FIG. 10. In one embodiment, dry etch 64 may be referred to as a third etch step of dry etch 22 and may be referred to as a soft etch step. In one embodiment, the soft etch step is performed using a lower etch power as compared to the main etch step such that a lower etch rate results. In this manner, dry etch 64 is more delicate as compared to dry etch 22. In one embodiment, a same etch chemistry may be used in both the main etch step and the soft etch step, with the exception that the soft etch step may include an oxidizing agent. The oxidizing agent may include for example, oxygen ($O_2$) or helium oxide ($HeO_2$). In one embodiment, to result in a lower etch rate, one or more etch parameters may be changed between the main etch step and the soft etch step, such as, for example, etch chemistry, RF power, etch bias, etc., or combinations thereof.

Figure 11:
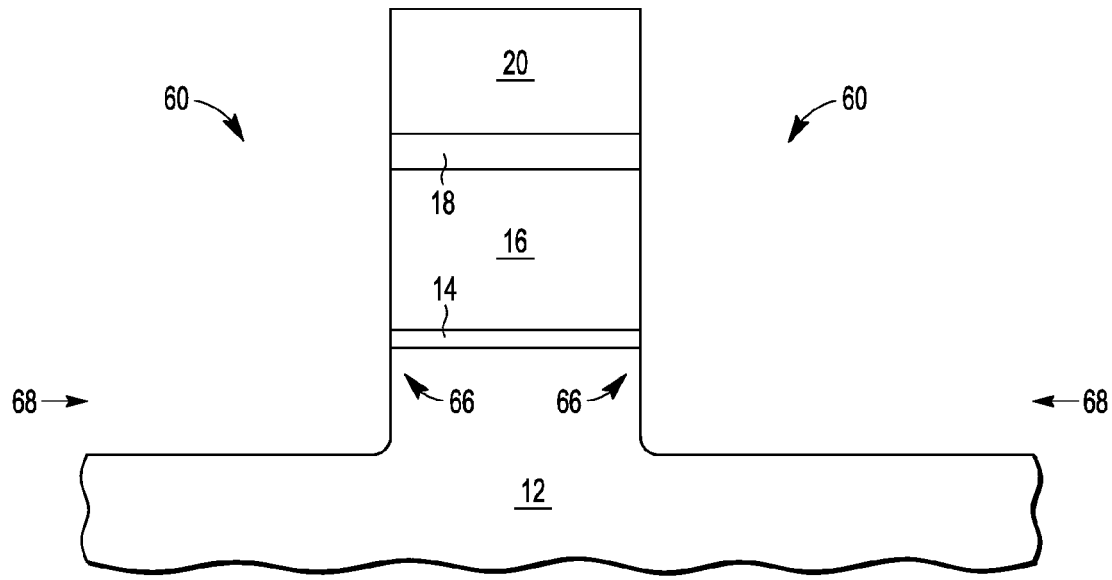

FIG. 11 illustrates semiconductor structure 100 after completion of dry etch 64 in which deep recesses 68 are formed in substrate 12 in regions 60, adjacent select gate electrode 16. As described above, the soft etch step includes an oxidizing agent which allows for thin oxides to be formed on exposed portions of substrate 12 which are removed during the soft etch process. For example, these thin oxides may be iteratively formed and removed during the soft etch process. The use of the oxidizing agent may help the quality of the surface of substrate 12 being etched, such as by preventing pitting. In this manner, the surface of recesses 68 may allow for an improved interface with subsequent layers. In one embodiment, recesses 68 have a depth of approximately 200 Angstroms from the top surface of substrate 12 located under patterned masking layer 20. Note that after formation of recesses 68, a wet etch may be used to remove patterned masking layer 20.

Figure 12:
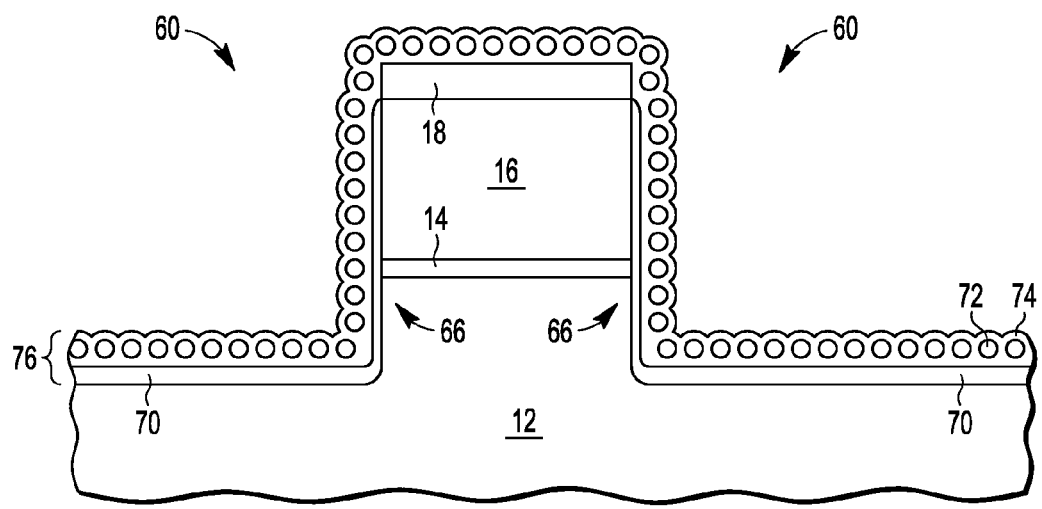

FIG. 12 illustrates semiconductor structure 100 after forming a charge storage layer 76 over substrate 12 in recesses 68 and over select gate electrode 16. In one embodiment, charge storage layer 76 includes an oxide 70 grown on exposed portions of substrate 12 in recesses 68 and along sidewalls of select gate electrode 16, nanocrystals 72 formed over oxide 70 and select gate electrode 16 (e.g. over ARC layer 18 of gate electrode 16), and an insulating layer 74 surrounding nanocrystals 72. Note that the charge storage layer 76 is analogous to charge storage layer 44, and therefore, the descriptions provided above with respect to charge storage layer 44, oxide 38, nanocrystals 40, and insulating layer 42 also apply to charge storage layer 76, oxide 70, nanocrystals 72, and insulating layer 74, respectively. Therefore, in one embodiment, as with charge storage layer 44, charge storage layer 76 may be referred to as a thin storage layer which has a thickness of at most approximately 30 nanometers. Note that a portion of charge storage layer 76 is formed in recesses 68 and another portion of charge storage layer 76 is formed along a first sidewall of select gate electrode 16. In alternate embodiments, any type of charge storage layer may be used. For example, charge storage layer 76 may include a single nitride layer, a trap oxide layer, or may include a stack of different layers.

Figure 13:
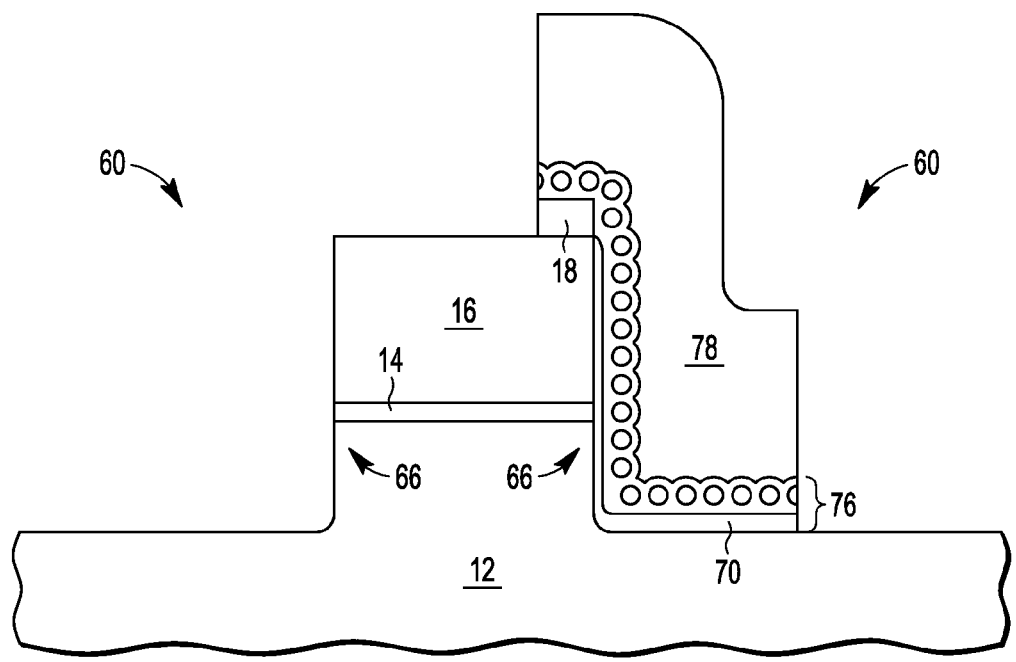

FIG. 13 illustrates semiconductor structure 100 after formation of a control gate electrode 78 (also referred to as a control gate) over a portion of select gate electrode 16 and over substrate 12 within recess 68 adjacent a first sidewall of select gate electrode 16. That is, note that control gate electrode 78 is formed such that it overlies a portion of select gate electrode 16 and extends over a sidewall of select gate electrode 16 onto substrate 12 within recess 68 adjacent the sidewall of select gate electrode 16. In one embodiment, control gate electrode 78 is formed using conventional deposition and etching techniques. Note that during the etch to form control gate electrode 78, portions of charge storage layer 76 are also etched, such that charge storage layer 76 remains between control gate electrode 78 and select gate electrode 16 and between control gate electrode 78 and substrate 12. In one embodiment, control gate electrode 78 may include polysilicon, a metal, titanium nitride, etc., or combinations thereof.

Figure 14:
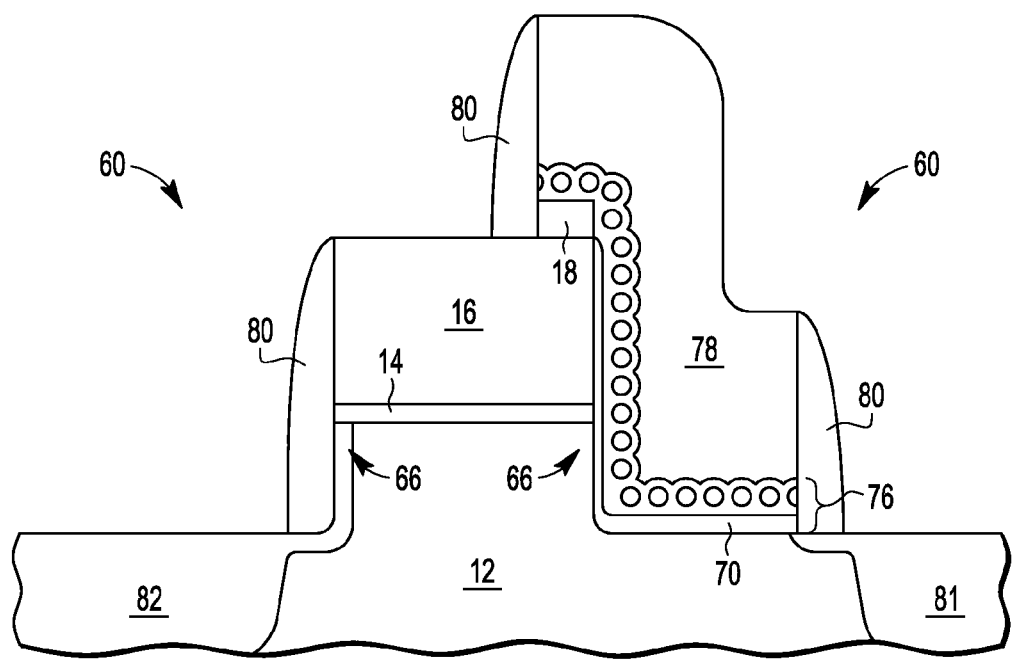

FIG. 14 illustrates semiconductor structure 100 after formation of spacers 80 and formation source/drain regions 82 and 81 in substrate 12 to form a substantially completed split gate device. A first spacer of spacers 80 is formed along a sidewall of select gate electrode 16, and a second and third spacer of spacers 80 are formed along sidewalls of charge storage layer 76 and control gate electrode 78. Conventional processing and materials may be used to form spacers 80. Conventional processing may be used to form source/drain regions 82 and 81. In one embodiment, source/drain region 82 includes an extension region which extends under gate dielectric layer 14 and source/drain region 81 includes an extension region which extends under charge storage layer 76. In one embodiment, source/drain region 81 may be referred to as a source region which is adjacent a first sidewall of select gate electrode 16 where a portion of control gate electrode 78 is between the first sidewall of select gate electrode 16 and the source region, and source/drain region 82 may be referred to as a drain region which is adjacent a second sidewall of select gate electrode 16.

Therefore, a substantially completed nanocrystal split gate device (also referred to as a split gate bitcell) is illustrated in FIG. 14. As described above with respect to FIG. 8 and recess 35, recess 68 may allow for an increased breakdown voltage and thus helps improve program and erase operation. Also, the thicker oxide at the corner of recess 68 may also allow for different polarities of an erase operation of the device and may also reduce any gap nanocrystal effect. The recessed regions in which charge storage layer 76 is formed may also allow for improved program operation due to improved ballistic injection and improved current drive. Note that vertical wall 66 of recess 68 is substantially vertical as it extends into substrate 12. This vertical wall may reduce program disturb for cells on unselected row and unselected columns by reducing the peak electric field in substrate 12 between the select gate and control gate (gap region), typically near the surface of substrate 12, adjacent to the select gate. A sufficiently high peak electric field in the gap region leads to generation of carriers by band-to-band tunneling. Carriers generated in the gap may subsequently lead to disturb of erased bits.

By now it should be appreciated that there has been provided a method for forming a nanocrystal split gate device useful as a bitcell in a memory. Through the use of shallow or deep recessed regions which may allow for rounded corners and for a thicker oxide beneath the nanocrystals, an improved split gate device may be achieved.

Although the invention has been described with respect to specific conductivity types or polarity of potentials, skilled artisans appreciated that conductivity types and polarities of potentials may be reversed.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Although the invention is described herein with reference to specific embodiments, various modifications and changes can be made without departing from the scope of the present invention as set forth in the claims below. For example, different thin charge storage layers may be used, spacers (such as spacer 22) may be left within the final device, or two devices which share a source/drain region may be formed. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

The following are various embodiments of the present invention.

Item 1 includes a method for forming a semiconductor device including forming a dielectric layer over a substrate; forming a select gate layer over the dielectric layer; etching the select gate layer at a first etch rate to form a first portion of a sidewall of a select gate, wherein the step of etching the select gate layer at the first etch rate includes using an oxidizing agent to oxidize at least a top portion of the substrate underlying the dielectric layer to form an oxide layer below the dielectric layer; and etching the select gate layer at a second etch rate lower than the first etch rate to form a second portion of the sidewall of the select gate, wherein the step of etching the select gate layer at the second etch rate includes removing only a top portion of the dielectric layer. Item 2 includes the method of item 1, wherein the oxidizing agent is selected from a group consisting of oxygen and helium oxide. Item 3 includes the method of item 1, and further includes removing the oxide layer and any remaining portion of the dielectric layer to expose a portion of the substrate; forming a charge storage layer overlying exposed portion of the substrate and the sidewall of the select gate; forming a control gate layer overlying the charge storage layer; and forming a control gate by patterning the control gate layer and the charge storage layer. Item 4 includes the method of item 3, wherein the step of forming the charge storage layer comprises forming a layer of one of a group consisting of nanocrystals, nitride, and oxide. Item 5 includes the method of item 1, wherein the step of etching the select gate layer at the first etch rate comprises using a RF plasma at a first etch power and the step of etching the select gate layer at the second etch rate comprises using the RF plasma at a second etch power lower than the first etch power. Item 6 includes the method of item 1, wherein the step of etching the select gate layer at the first etch rate comprises using a RF plasma at a first etch bias and the step of etching the select gate layer at the second etch rate comprises using the RF plasma at a second etch bias lower than the first etch bias. Item 7 includes the method of item 1, wherein the step of etching the select gate layer at the first etch rate comprises using a first etch chemistry and the step of etching the select gate layer at the second etch rate comprises using a second etch chemistry, wherein the second etch chemistry is different from the first etch chemistry. Item 8 includes the method of item 1 and further includes removing the oxide layer and any remaining portion of the dielectric layer to form a recess in the substrate adjacent to the sidewall of the select gate.

Item 9 includes a method for forming a semiconductor device including forming a dielectric layer over a substrate; forming a select gate layer over the dielectric layer; using a first etch chemistry etching the select gate layer at a first etch rate to form a sidewall of a select gate; using a second etch chemistry different from the first etch chemistry, selectively etching the dielectric layer; and etching the substrate at a second etch rate lower than the first etch rate to form a recess in the substrate adjacent to the sidewall of the select gate, wherein the step of etching the substrate at the second etch rate includes using an oxidizing agent. Item 10 includes the method of item 9, wherein the oxidizing agent is selected from a group consisting of oxygen and helium oxide. Item 11 includes the method of item 9 and further includes forming a charge storage layer overlying any exposed portion of the substrate and the sidewall of the select gate; forming a control gate layer overlying the charge storage layer; and forming a control gate by patterning the control gate layer and the charge storage layer. Item 12 includes the method of item 11, wherein the step of forming the charge storage layer comprises forming a layer of one of a group consisting of nanocrystals, nitride, and oxide. Item 12 includes the method of item 9, wherein the step of etching the select gate layer at the first etch rate comprises using a RF plasma at a first etch power and the step of etching the substrate at the second etch rate comprises using the RF plasma at a second etch power lower than the first etch power. Item 14 includes the method of item 9, wherein the step of etching the select gate layer at the first etch rate comprises using a RF plasma at a first etch bias and the step of etching the substrate at the second etch rate comprises using the RF plasma at a second etch bias lower than the first etch bias. Item 15 includes the method of item 9, wherein the step of etching the substrate at the second etch rate comprises using a third etch chemistry, wherein the third etch chemistry is different from the first etch chemistry. Item 16 includes the method of item 9, wherein the step of etching the substrate at a second etch rate lower than the first etch rate to form the recess in the substrate comprises forming a substantially vertical recess.

Item 17 includes a method for forming a semiconductor device including forming a dielectric layer over a substrate; forming a select gate layer over the dielectric layer; etching the select gate layer at a first etch rate to form a first portion of a sidewall of a select gate, wherein the step of etching the select gate layer at the first etch rate includes using an oxidizing agent to oxidize at least a top portion of the substrate underlying the dielectric layer to form an oxide layer below the dielectric layer; etching the select gate layer at a second etch rate lower than the first etch rate to form a second portion of the sidewall of the select gate, wherein the step of etching the select gate layer at the second etch rate includes removing only a top portion of the dielectric layer; using a wet etch removing the oxide layer and any remaining portion of the dielectric layer to expose a portion of the substrate; forming a charge storage layer overlying exposed portion of the substrate and the sidewall of the select gate; forming a control gate layer overlying the charge storage layer; and forming a control gate by patterning the control gate layer and the charge storage layer. Item 18 includes the method of item 17, wherein the oxidizing agent is selected from a group consisting of oxygen and helium oxide. Item 19 includes the method of item 18, wherein the step of forming the charge storage layer comprises forming a layer of one of a group consisting of nanocrystals, nitride, and oxide. Item 20 includes the method of item 19, wherein the second etch rate is lower than the first etch rate as a result of a variation in at least one of an etch power, an etch bias, and an etch chemistry associated with a respective etching step.

What is claimed is:

1. A method for forming a semiconductor device, the method comprising:
    forming a dielectric layer over a substrate;
    forming a select gate layer over the dielectric layer;
    etching the select gate layer at a first etch rate to form a first portion of a sidewall of a select gate and to leave remaining portions of the select gate layer covering the dielectric layer, wherein the step of etching the select gate layer at the first etch rate includes using an oxidizing agent to oxidize at least a top portion of the substrate underlying the dielectric layer to form an oxide layer below the dielectric layer, wherein the oxidizing agent is selected from a group consisting of oxygen and helium oxide;
    etching the select gate layer at a second etch rate lower than the first etch rate to form a second portion of the sidewall of the select gate, wherein the step of etching the select gate layer at the second etch rate includes removing only a top portion of the dielectric layer, wherein the second etch rate is lower than the first etch rate due to a variation in at least one of an etch power, an etch bias, and an etch chemistry associated with the respective etching step;
    removing the oxide layer and any remaining portion of the dielectric layer to expose a portion of the substrate;
    forming a charge storage layer overlying exposed portion of the substrate and the sidewall of the select gate;
    forming a control gate layer overlying the charge storage layer; and
    forming a control gate by patterning the control gate layer and the charge storage layer.

2. The method of claim 1, wherein the step of forming the charge storage layer comprises forming a layer of one of a group consisting of nanocrystals, nitride, and oxide.

3. The method of claim 1, wherein the step of etching the select gate layer at the first etch rate comprises using a RF plasma at a first etch power and the step of etching the select gate layer at the second etch rate comprises using the RF plasma at a second etch power lower than the first etch power.

4. The method of claim 1, wherein the step of etching the select gate layer at the first etch rate comprises using a RF plasma at a first etch bias and the step of etching the select gate layer at the second etch rate comprises using the RF plasma at a second etch bias lower than the first etch bias.

5. The method of claim 1, wherein the step of etching the select gate layer at the first etch rate comprises using a first etch chemistry and the step of etching the select gate layer at the second etch rate comprises using a second etch chemistry, wherein the second etch chemistry is different from the first etch chemistry.

6. The method of claim 1 further comprising removing the oxide layer and any remaining portion of the dielectric layer to form a recess in the substrate adjacent to the sidewall of the select gate.

7. A method for forming a semiconductor device, the method comprising:
    forming a dielectric layer over a substrate;
    forming a select gate layer over the dielectric layer;
    using a first etch chemistry for etching the select gate layer at a first etch rate to form a sidewall of a select gate and to leave remaining portions of the dielectric layer covering the substrate;
    using a second etch chemistry different from the first etch chemistry, selectively etching the dielectric layer;
    etching the substrate at a second etch rate lower than the first etch rate to form a recess in the substrate adjacent to the sidewall of the select gate, wherein the step of etching the substrate at the second etch rate includes using an oxidizing agent, wherein the step of etching the substrate at the second etch rate lower than the first etch rate to form the recess in the substrate comprises forming a substantially vertical recess, and wherein the oxidizing agent is selected from a group consisting of oxygen and helium oxide;
    forming a charge storage layer overlying any exposed portion of the substrate and the sidewall of the select gate;
    forming a control gate layer overlying the charge storage layer; and
    forming a control gate by patterning the control gate layer and the charge storage layer.

8. The method of claim 7, wherein the step of forming the charge storage layer comprises forming a layer of one of a group consisting of nanocrystals, nitride, and oxide.

9. The method of claim 7, wherein the step of etching the select gate layer at the first etch rate comprises using a RF plasma at a first etch power and the step of etching the substrate at the second etch rate comprises using the RF plasma at a second etch power lower than the first etch power.

10. The method of claim 7, wherein the step of etching the select gate layer at the first etch rate comprises using a RF plasma at a first etch bias and the step of etching the substrate at the second etch rate comprises using the RF plasma at a second etch bias lower than the first etch bias.

11. The method of claim 7, wherein the step of etching the substrate at the second etch rate comprises using a third etch chemistry, wherein the third etch chemistry is different from the first etch chemistry.

12. A method for forming a semiconductor device, the method comprising:
    forming a dielectric layer over a substrate;
    forming a select gate layer over the dielectric layer;
    etching the select gate layer at a first etch rate to form a first portion of a sidewall of a select gate and to leave remaining portions of the select gate layer covering the dielectric layer, wherein the step of etching the select gate layer at the first etch rate includes using an oxidizing agent to oxidize at least a top portion of the substrate underlying the dielectric layer to form an oxide layer below the dielectric layer, wherein the oxidizing agent is selected from a group consisting of oxygen and helium oxide;

etching the select gate layer at a second etch rate lower than the first etch rate to form a second portion of the sidewall of the select gate, wherein the step of etching the select gate layer at the second etch rate includes removing only a top portion of the dielectric layer, wherein the second etch rate is lower than the first etch rate due to a variation in at least one of an etch power, an etch bias, and an etch chemistry associated with the respective etching step;

using a wet etch removing the oxide layer and any remaining portion of the dielectric layer to expose a portion of the substrate;

forming a charge storage layer overlying exposed portion of the substrate and the sidewall of the select gate;

forming a control gate layer overlying the charge storage layer; and forming a control gate by patterning the control gate layer and the charge storage layer.

13. The method of claim 12, wherein the step of forming the charge storage layer comprises forming a layer of one of a group consisting of nanocrystals, nitride, and oxide.

* * * * *